(12) United States Patent
West et al.

(10) Patent No.: US 8,125,053 B2
(45) Date of Patent: Feb. 28, 2012

(54) EMBEDDED SCRIBE LANE CRACK ARREST STRUCTURE FOR IMPROVED IC PACKAGE RELIABILITY OF PLASTIC FLIP CHIP DEVICES

(75) Inventors: Jeffrey A. West, Dallas, TX (US); Patricia Diane Vincent, Prosper, TX (US); Robert A. Tuerck, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/365,333

(22) Filed: Feb. 4, 2009

(65) Prior Publication Data

US 2010/0193918 A1   Aug. 5, 2010

(51) Int. Cl.
*H01L 23/544* (2006.01)
(52) U.S. Cl. .. 257/620; 257/621; 257/623; 257/E23.194
(58) Field of Classification Search .................. 257/620, 257/621, 623, E23.194
See application file for complete search history.

(56) References Cited

U.S. PATENT DOCUMENTS

| 6,365,958 | B1 | 4/2002 | Ibnabdeljalil et al. | |
| 6,521,975 | B1 | 2/2003 | West et al. | |
| 6,841,455 | B2 | 1/2005 | West et al. | |
| 7,129,566 | B2 * | 10/2006 | Uehling et al. | 257/620 |
| 2009/0039470 | A1 * | 2/2009 | Vo | 257/620 |
| 2010/0025824 | A1 * | 2/2010 | Chen et al. | 257/620 |

* cited by examiner

*Primary Examiner* — Tan N Tran
(74) *Attorney, Agent, or Firm* — Jacqueline J. Garner; Wade J. Brady, III; Frederick J. Telecky, Jr.

(57) ABSTRACT

A system, method, and apparatus for suppressing cracks in the wafer dicing process. A wafer includes a plurality of die attached to a frame and mounting tape, with the die separated by a plurality of scribe lanes. An existing die seal generally protects the boundary of the die but can still fail to fully protect the die from excessive cracks induced by dicing damage, particularly when dicing through brittle, low-k dielectrics. The system, method, and apparatus includes embedding a crack arrest structure (CAS) between adjacent scribe lanes. Upon a mechanical saw dicing the wafer, the CAS creates a moisture diffusion block, and can absorb or significantly diminish the energy of cracks propagating towards the individual die seals. Furthermore, the system, method, and apparatus can be implemented without the need to increase the width of the scribe lanes.

12 Claims, 3 Drawing Sheets

EMBEDDED SCRIBE LANE CRACK ARREST STRUCTURE FOR IMPROVED IC PACKAGE RELIABILITY OF PLASTIC FLIP CHIP DEVICES

FIELD OF THE INVENTION

This invention generally relates to semiconductor wafers having embedded crack arrest structures (CAS) to suppress damage resulting from the wafer dicing process.

BACKGROUND OF THE INVENTION

A wafer is a thin slice of semiconductor material often containing a plurality of microdevices, or dies. Dies are fabricated on the wafer, which is suspended within a supporting frame via mounting tape. A sawing or dicing process is performed on the wafer to separate the individual dies from each other. The mounting tape continues to hold the dies after the dicing process until the separated dies are removed from the mounting tape. Once fully removed, the dies are packaged and put into end-user electronic devices, usually as integrated circuits to provide electronic functionality to the devices.

The wafer surface is designed so that the individual dies are separated by a plurality of scribe lanes. A physical cutting tool such as a saw uses the scribe lanes as a cutting line during the separation process. The widths of the scribe lanes can vary depending on the width of the saw blade, but the scribe lines are at least wide enough to allow for the width of the saw blade. The scribe lane width is typically much smaller than the width of the individual dies. As such, the scribe lanes occupy a small portion of the wafer's surface area. Further, there can be multiple scribe lanes between adjacent die depending on the number of sacrificial electrical test modules required for verification of wafer conformance to electrical specifications prior to the die separation process.

A problem exists in known wafer dicing methods, however, when chipping or cracking of the die edge occurs during the dicing cut, particularly when dicing through brittle, low-k dielectrics. Although most dies incorporate die seals that help protect the edges of the dies, the dies are still highly susceptible to collateral damage from the dicing operation. In particular, cracks resulting from the dicing process can propagate significant distances from the saw line, and moisture from water exposure or intentional acceleration resulting from exposing packages to humid environments can lead to massive cracks in the scribe lanes that can migrate towards the die seal. In certain cases, such a crack can rupture the die seal and curtail the lifetime of the die.

SUMMARY OF THE INVENTION

An embodiment is directed to a system for decreasing damage from wafer dicing. According to embodiments in one regard, the wafer includes adjacent die each surrounded by a die seal. Further, scribe lanes are formed between the adjacent die. Still further, a crack arrest structure is located outside the die seals and between adjacent scribe lanes Another embodiment is directed to a method of decreasing damage from wafer dicing. The method includes providing a wafer with adjacent die formed thereon. The method also includes providing scribe lanes located between the adjacent die and forming a crack arrest structure between the scribe lanes.

Another embodiment is directed to an apparatus for minimizing crack damage from wafer dicing. The apparatus includes a wafer with a plurality of die and at least one scribe lane disposed thereon, wherein the at least one scribe lane is located between the plurality of die. The apparatus also includes a crack arrest structure located within the at least one scribe lane.

BRIEF DESCRIPTION OF THE DRAWINGS

The accompanying drawings, which are incorporated in and constitute a part of this specification, illustrate embodiments of the present disclosure and together with the description, serve to explain the embodiments.

DESCRIPTION OF THE EMBODIMENTS

Figure 1:
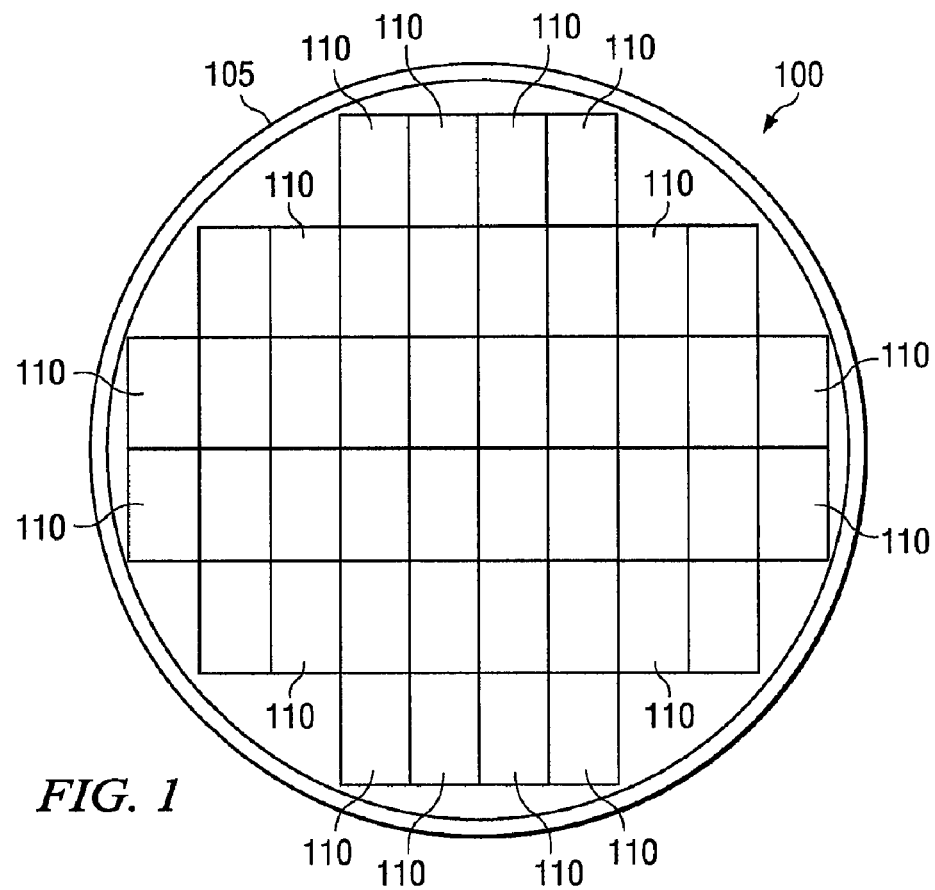
FIG. 1 is a diagram illustrating a layout of an exemplary wafer containing a plurality of die.

Embodiments of the present disclosure are directed towards a system, method, and apparatus for suppressing cracks during the wafer dicing process. The crack suppression technology reduces damage to the wafer die and allows for improved package reliability. The system can be implemented on new or existing wafer designs, which minimizes both manufacturing and redesign costs.

The crack suppression system utilizes crack arrest structures (CAS) to reduce the formation and acceleration of cracks resulting from the wafer dicing operation. Further, the CAS provides a moisture diffusion block to prevent moisture from entering the dielectrics between the CAS and the die, thereby preventing an increase in crack propagation rates toward the die. The wafer initially contains a plurality of die that need to be separated from each other. The plurality of die each contain a die seal around the border of the die for an initial layer of protection against cracks, moisture, and other damage. For example, U.S. Pat. Nos. 6,521,975 and 6,841,455 explain die seals and are hereby incorporated by reference into the present invention. Scribe lanes are present on the wafer and function to separate the plurality of die. Further, scribe lanes provide a line location for a saw to cut the wafer. When three (3) or more scribe lanes are present between adjacent die, a CAS can be placed between adjacent scribe lanes and on opposite sides of the saw line. Generally, only one CAS is needed on each side of the saw line. However, in embodiments, multiple CAS can be used to further improve the crack-suppression efficiency.

The CAS can be similar in structure to the die seal present around the borders of the individual die. Further, the CAS can have a width as small as, for example, about 1 micron. The CAS can be made of metal or a similar material, and can be configured with multiple layers situated on top of one another. The number of layers of the CAS can be dependant on the number of metal layers of a given die. The width of the CAS can be sufficiently narrow to be inserted between existing scribe lanes such that existing wafer designs would not require a widening of the scribe lanes, thus minimizing implementation costs.

Reference will now be made in detail to the exemplary embodiments of the disclosure, an example of which is illustrated in the accompanying drawings. Wherever possible, the same reference names and numbers will be used throughout the drawings to refer to the same or like parts.

In the following description, reference is made to the accompanying drawings that form a part thereof, and in which is shown by way of illustration-specific exemplary embodiments. These embodiments are described in sufficient detail to enable those skilled in the art to practice the embodiments and it is to be understood that other embodiments can be used and that changes can be made without departing from the scope of this disclosure. The following description is, therefore, merely exemplary.

FIG. 1 is a diagram illustrating a layout of an exemplary wafer 100 containing a plurality of die. Wafer 100 includes a supporting frame 105, a plurality of die 110, and mounting tape (not shown in figures). The mounting tape is attached to supporting frame 105 and secures plurality of die 110 together after the dicing operation. Plurality of die 110 are arranged in a matrix fashion and are mounted to the mounting tape so as to secure plurality of die 110 to supporting frame 105. Wafer dicing is performed on wafer 100 to separate plurality of die 110 from one another. After the dicing operation and during the transport of supporting frame 105 containing wafer 100 to the next assembly step, the mounting tape continues to hold plurality of die 110. Once ready, plurality of die 110 are removed from the mounting tape by die-handling equipment.

Figure 2:
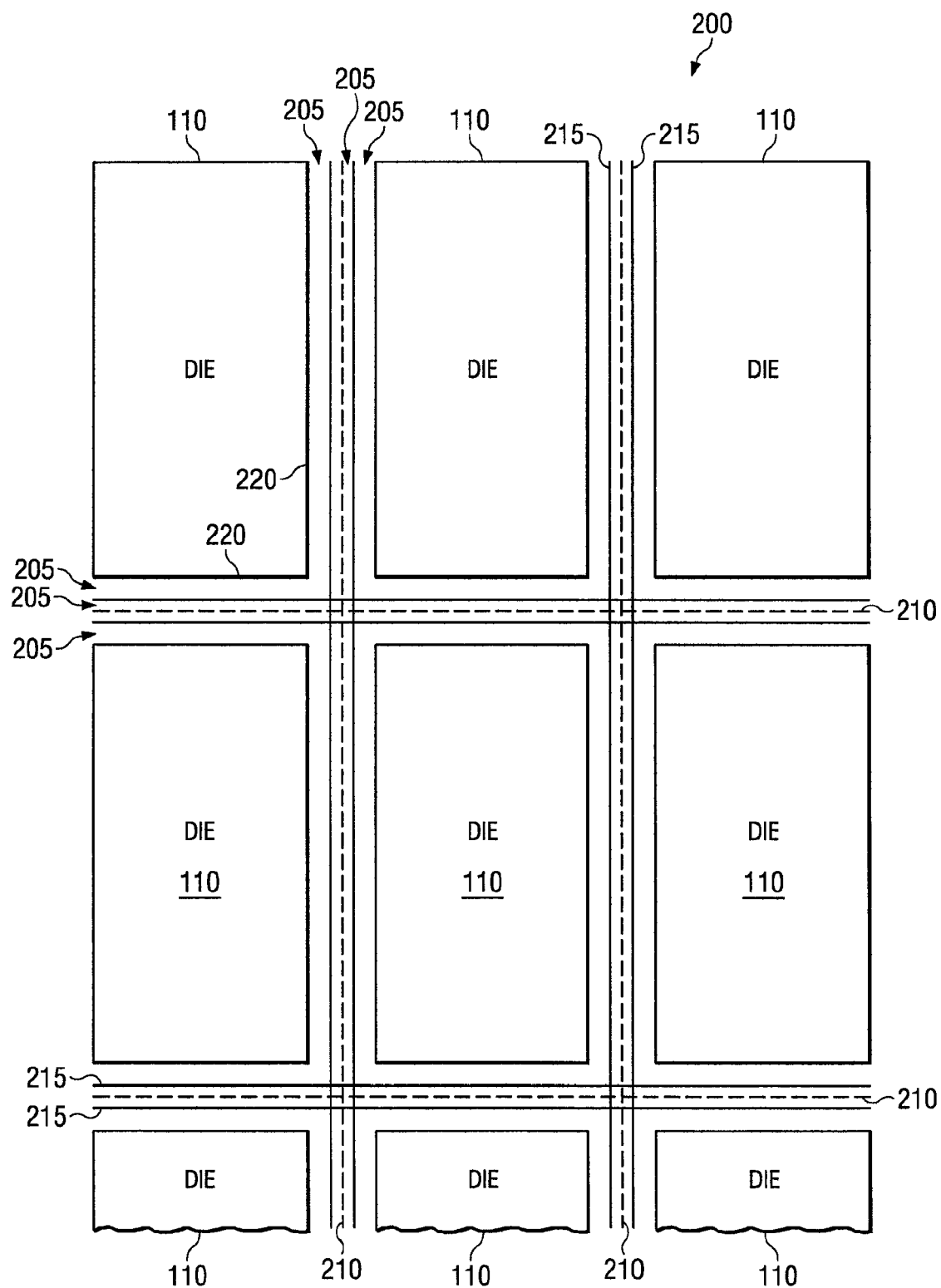
FIG. 2 is a diagram illustrating an exemplary wafer layout with a plurality of die and scribe lanes contained thereon.

FIG. 2 is a diagram illustrating an exemplary wafer layout 200 with a plurality of die and scribe lanes contained thereon. Wafer layout 200 includes plurality of die 110 separated by a plurality of scribe lanes 205. Each of plurality of die 110 has an integrated circuit or similar electrical component formed thereon. Plurality of scribe lanes 205 can be configured to separate and secure together adjacent die within plurality of die 110. Further, plurality of scribe lanes 205 can be configured to provide space for a mechanical saw to cut through during the dicing operation. Plurality of scribe lanes 205 can be configured to vary in width, usually from about 50 μm to 150 μm. Further, there can be one or more scribe lanes 205 between adjacent die in plurality of die 110.

A mechanical cutting tool such as a saw or laser can be used to separate each of the die in plurality of die 110 from one another. Wafer layout 200 further includes a plurality of saw lines 210. Plurality of saw lines 210 can be predetermined lines located within one or more of plurality of scribe lanes 205. Plurality of saw lines 210 can be a guide along which the saw dices wafer 100 to separate plurality of die 110 from one another. The width of saw lines 210 can be determined by the width of the saw blade that is used to make the cut. Plurality of saw lines 210 can be located within one of plurality of scribe lanes 205 or along the boundary between adjacent scribe lanes 205. In embodiments, plurality of die 110 can be separated by other methods such as, for example, a laser process used to weaken an area of scribe lanes 205 before separation.

Wafer layout 200 further includes a plurality of crack arrest structures (CAS) 215 disposed between adjacent die of plurality of die 110 as indicated by the solid lines in FIG. 2. In embodiments, CAS 215 can be located between adjacent scribe lanes 205 when there are three (3) or more scribe lanes 205 between adjacent die 110. CAS 215 can be arranged to be duplicately and symmetrically disposed on opposite sides of saw lines 210. CAS 215 can be more effective when placed near a crack initiation point since crack energy increases as the crack lengthens. As such, CAS 215 can be located in the boundary between scribe lanes 205 and near saw lines 210. Further, because CAS 215 are sufficiently narrow and can be placed between existing scribe lanes 205, wafer layout 200 need not be redesigned and adjacent die of plurality of die 110 need not require further separation. In embodiments, CAS 215 can be located within scribe lanes 205. In another embodiment, only one scribe lane 205 can be located between adjacent die 110, and one or more CAS 215 can be located within single scribe lane 205.

Plurality of die 110 each have a die seal 220 circumscribing the integrated circuit within die 110. Die seal 220 can prevent the integrated circuit from delaminating due to stress caused from the dicing process, and can also protect die 110 from cracks originating in scribe lanes 205. Although die seal 220 provides some protection from cracking and stress, die seal 220 may not be sufficient to prevent all damage resulting from the dicing process. CAS 215 can provide an added barrier of protection from cracking and moisture damage, and CAS 215 can absorb or significantly diminish the energy of the crack so that the crack is prevented from extending to die seal 220. Further, because CAS 215 are located near crack initiation points, CAS 215 can be more effective at arresting the cracks and preventing further propagation towards die seal 220.

Figure 3A:
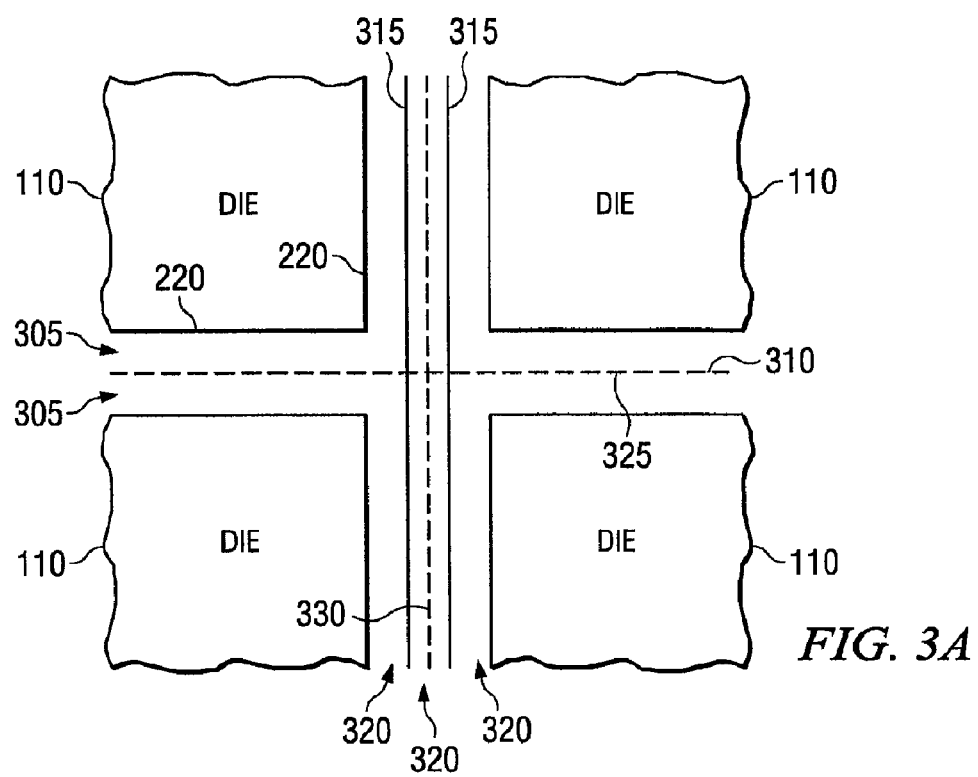
FIG. 3A is a diagram illustrating an exemplary layout of a plurality of die and scribe lanes.

FIG. 3A is a diagram illustrating an exemplary layout of a plurality of die and scribe lanes. As shown in FIG. 3A, plurality of die 110 are separated by three (3) vertical scribe lanes 320 and two (2) horizontal scribe lanes 305. Accordingly, vertical scribe lanes 320 are configured with two (2) vertical CAS 315 each located between vertical scribe lanes 320. More particularly, vertical CAS 315 are placed between adjacent vertical scribe lanes 320. Further, there is a vertical saw line 330 located through the center of the middle vertical scribe lane 320.

A horizontal saw line 310 is located between adjacent horizontal scribe lanes 305. There exists no horizontal CAS between horizontal scribe lanes 305 because such placement would result in a CAS that is coincident with horizontal saw line 310 and the CAS would be removed during the sawing process. Accordingly, CAS are more suited to be placed between adjacent scribe lanes when there are three or more scribe lanes between adjacent die 110. However, in embodiments, it should be appreciated that CAS can be placed within a scribe lane on either or both sides of a saw line, in cases where there are one or more scribe lanes between plurality of die 110. Further, in embodiments, it should be appreciated that plurality of die 110 can be separated by other methods, such as, for example, a laser process, in which the CAS can still block moisture and suppress cracks resulting from the laser weakening the scribe lanes.

Figure 3B:
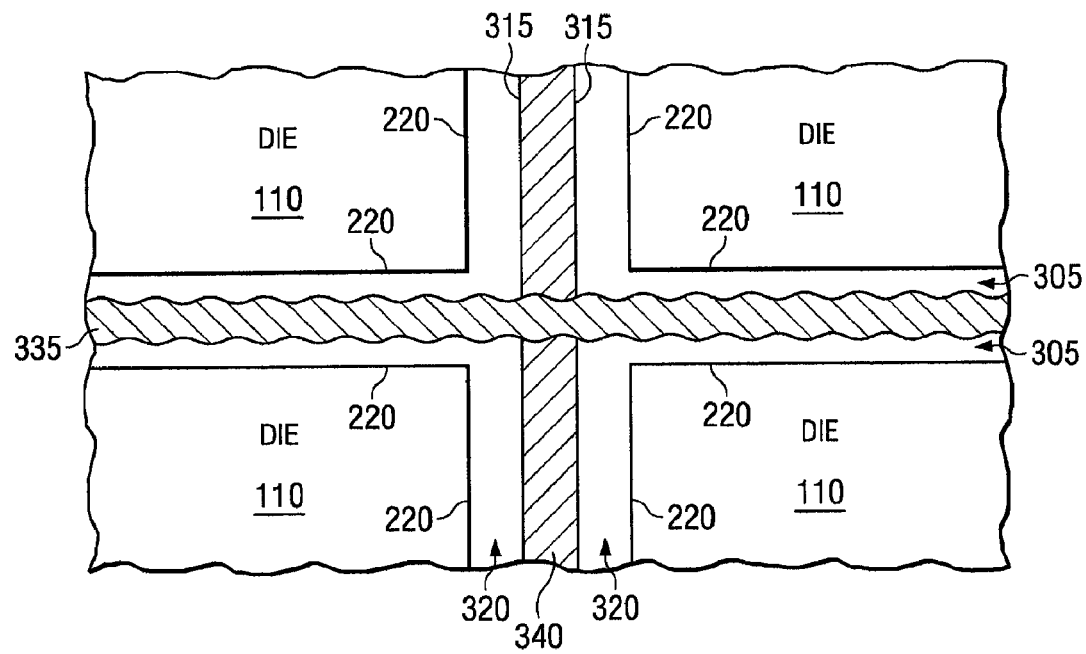
FIG. 3B is a diagram illustrating an exemplary layout of a plurality of die and scribe lanes after the dicing operation.

FIG. 3B is a diagram illustrating an exemplary layout of a plurality of die and scribe lanes after the dicing operation. Similar to FIG. 3A, FIG. 3B includes plurality of die 110 protected by die seals 220, and separated by vertical scribe lanes 320 and horizontal scribe lanes 305. Further, vertical CAS 315 are located between adjacent vertical scribe lanes 320, whereas no CAS exist between horizontal scribe lanes 305. FIG. 3B further includes a horizontal cut 335 and a vertical cut 340. As shown in FIG. 3B, the edges of horizontal cut 335 within horizontal scribe lanes 305 are jagged and cracked because no horizontal CAS exists in horizontal scribe lanes 305. In contrast, the edges of vertical cut 340 within vertical scribe lanes 320 are straight and rigid, resulting from vertical CAS 315 arresting the cracks made from the sawing operation.

Figure 4:
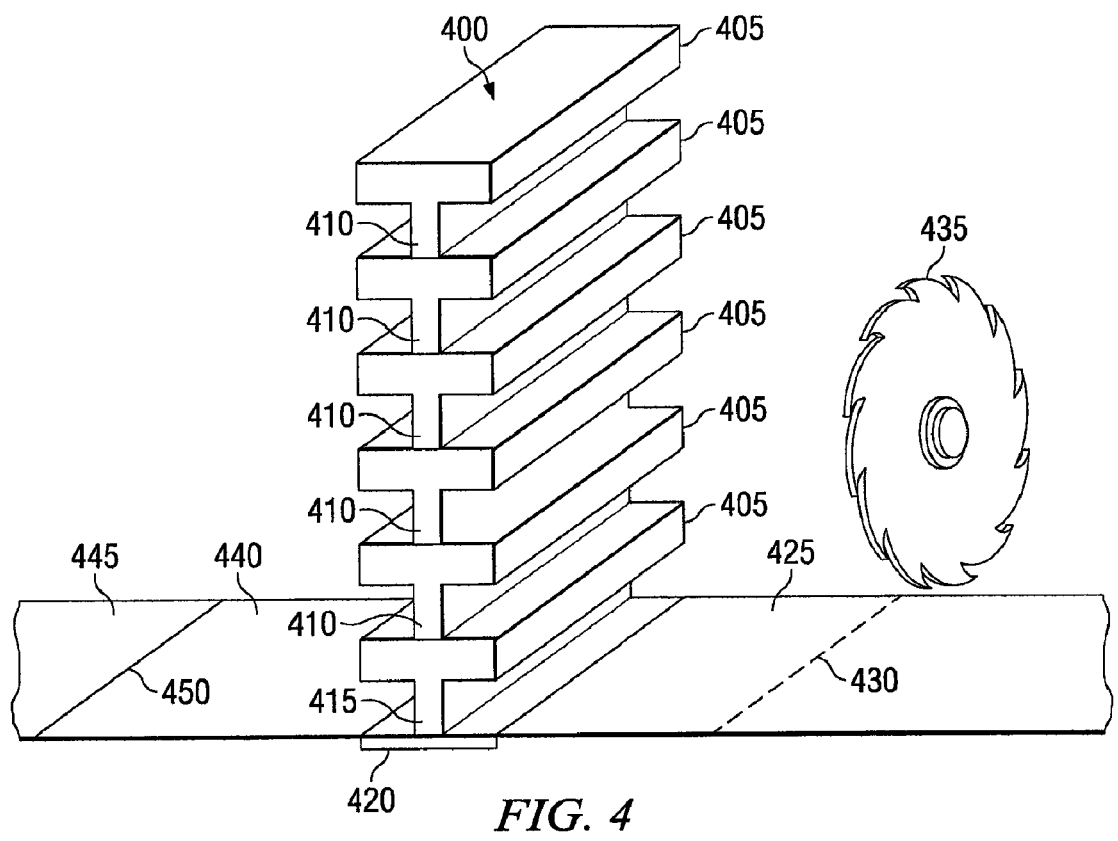
FIG. 4 is a diagram illustrating a cross-section of an exemplary crack arrest structure.

FIG. 4 is a diagram illustrating a cross-section of an exemplary CAS 400 disposed on adjacent scribe lanes 425, 440. It should be appreciated that CAS 400 can be embedded in dielectrics (not shown in figures) located on the underlying wafer, and that other features of scribe lanes 425, 440 are not shown in FIG. 4. CAS 400 includes a plurality of metal layers 405, a trench contact 415, and a plurality of via channels 410 between each of metal layers 405. Metal layers 405 can correspond to the number of layers of metal contained in the integrated circuit in plurality of die 110. Similarly, plurality of via channels 410 can correspond to the number of trenched vias contained in the integrated circuit in plurality of die 110. Metal layers 405 and via channels 410 can be metal, so as to create a solid wall of metal between the saw line 430 and the integrated circuits in plurality of die 110.

Trench contact 415 can be the interface where CAS 400 contacts an active area 420 of the substrate between adjacent scribe lanes 425, 440. Active area 420 is configured to receive standard implants so that CAS 400 can conduct electricity via trench contact 415. Active area 420 can further be configured to be electrically grounded.

Metal layers 405 can be configured to vary in width to achieve the desired support strength, but are generally sufficiently narrow to allow placement between scribe lanes without interfering with the functionality of intended structures contained within the scribe lanes, thus preventing the need to increase the lane width to accommodate the CAS. In embodiments, metal layers 405 are about 1 micron wide. Similarly, the height of via channels 410 can be restricted based on the size of the corresponding structures in the integrated circuit such as, for example, the trenched vias contained in the integrated circuit and the layers of low-k dielectrics between the CAS and plurality of die 110. The width of via channels 410 can be dependent upon the width of the corresponding via slot used in the die seal. Further, the width of via channels 410 can be widened in cases where the trenched vias are embedded in low-k dielectrics where additional strength is desired. Further, the number of metal layers 405 and via channels 410 in a given CAS 400 can vary depending on how many layers of metal and trenched vias, respectively, there are in the integrated circuit contained in plurality of die 110. In embodiments, the number of stacked metal layers 405 and via channels 410 in a given CAS 400 can vary depending on the number of layers in the low-k dielectrics between CAS 400 and plurality of die 110.

CAS 400 is configured to be located between adjacent scribe lanes 425, 440. In embodiments, the widths of scribe lanes 425, 440 can be adjusted to accommodate any particular CAS. Further, in embodiments, one or more CAS can be arranged within scribe lanes 425, 440 to further improve damage suppression.

As shown in FIG. 4, scribe lane 425 is configured with a saw line 430. CAS 400 is located a sufficient distance away from saw line 430 such that a saw 435 would not come into contact with CAS 400 while making a cut along saw line 430. Further, CAS 400 can be located at a point sufficiently close to where cracks would initiate following the dicing operation. Scribe lane 440 can be configured to be in contact with a die seal 450 (as shown in FIG. 4 as a representative location of a die seal) of a die 445 and CAS 400 can be located a distance away from die seal 450 of die 445. More particularly, as shown in FIG. 4, CAS 400 can be located between die seal 450 and saw line 430. After saw 435 makes a cut along saw line 430, resulting cracks in a dielectric over scribe lane 425 from the dicing operation can impinge upon CAS 400. CAS 400 can absorb or significantly diminish the energy of cracks resulting from the dicing operation, thus reducing damage to die seal 450 and die 445.

After saw 435 performs the dicing operation along saw line 430, die 445 can remain attached to a wafer via the mounting tape (not shown in figures). Die 445 can be configured to be extracted from the mounting tape by die handling equipment. After extraction, die 445 can be packaged and transferred to its intended component. The remainder of scribe lanes 425, 440, along with CAS 400 can remain with die 445 upon packaging.

What is claimed is:

1. A system for decreasing damage from wafer dicing, comprising:
   a row of die having a first die surrounded by a first die seal and a second die surrounded by a second die seal, the first die having a first side nearest the second die;
   a first scribe lane running parallel to said first side adjacent said first die seal;
   a second scribe lane running parallel to said first side adjacent the second die seal;
   a first crack arrest structure running parallel to said first side, the first crack arrest structure being separated from said first die by the first die seal and the first scribe lane; and
   a second crack arrest structure running parallel to the first side, the second crack arrest structure being separated from the second die by the second scribe lane and second die seal wherein the second crack arrest structure is separated from the first die by the first crack arrest structure, the first scribe lane and the first die seal.

2. The system of claim 1, further comprising:
   a saw line running parallel to and between the first crack arrest structure and the second crack arrest structure.

3. The system of claim 1, wherein the first crack arrest structure and the second crack arrest structure are metal.

4. The system of claim 1, wherein the first crack arrest structure and the second crack arrest structure are comprised of a number of metal layers and via channels, wherein the number of metal layers and via channels is dependent on a number of layers in low-k dielectrics between the first crack arrest structure and the first die.

5. The system of claim 1, wherein the first and second crack arrest structures are comprised of a number of metal layers and via channels, wherein the number of metal layers and via channels is respectively dependent on a number of layers of metal and trenched vias contained in the first die.

6. The system of claim 1, wherein the first and second crack arrest structures are disposed at an active area.

7. A method of decreasing damage from wafer dicing, comprising:
   providing a wafer having a row of die with a first die surrounded by a first die seal and a second die surrounded by a second die seal, the first die having a first side nearest the second die;
   forming a first scribe lane running parallel to said first side adjacent said first die seal;
   forming a second scribe lane running parallel to said first side adjacent the second die seal;
   forming a first crack arrest structure running parallel to said first side, the first crack arrest structure being separated from said first die by the first die seal and the first scribe lane; and
   forming a second crack arrest structure running parallel to the first side, the second crack arrest structure being separated from the second die by the second scribe lane and second die seal wherein the second crack arrest structure is separated from the first die by the first crack arrest structure, the first scribe lane and the first die seal.

8. The method of claim 7, further comprising:
   forming a saw line running parallel to and between the first crack arrest structure and the second crack arrest structure.

9. The method of claim 7, wherein the first crack arrest structure and the second crack arrest structure are metal.

10. The method of claim 7, wherein the first crack arrest structure and the second crack arrest structure are comprised of a number of metal layers and via channels, wherein the number of metal layers and via channels is dependent on a number of layers in low-k dielectrics between the first crack arrest structure and the first die.

11. The method of claim 7, wherein the first and second crack arrest structures are comprised of a number of metal layers and via channels, wherein the number of metal layers and via channels is respectively dependent on a number of layers of metal and trenched vias contained in the first die.

12. The method of claim 7, wherein the first and second crack arrest structures are disposed at an active area.

* * * * *